United States Patent [19]

Matsuda et al.

[11] Patent Number: 4,996,586
[45] Date of Patent: Feb. 26, 1991

[54] CRIMP-TYPE SEMICONDUCTOR DEVICE HAVING NON-ALLOY STRUCTURE

[75] Inventors: Hideo Matsuda; Takashi Fujiwara, both of Yokohama; Yoshio Yokota; Mitsuhiko Kitagawa, both of Tokyo; Masami Iwasaki; Kazuo Watanuki, both of Yokohama, all of Japan

[73] Assignee: Kabushiki Kaisha Toshiba, Kawasaki, Japan

[21] Appl. No.: 422,900

[22] Filed: Oct. 17, 1989

[30] Foreign Application Priority Data

Oct. 19, 1988 [JP] Japan .................. 63-263455

[51] Int. Cl.$^5$ .................. H01L 27/02; H01L 23/54; H01L 29/08
[52] U.S. Cl. .................. 357/74; 357/79
[58] Field of Search .................. 357/79, 76, 77, 74, 357/68, 38, 75

[56] References Cited

U.S. PATENT DOCUMENTS 4,587,550 5/1986 Matsuda .
4,626,888 12/1986 Wagano et al. .................. 357/68
4,775,916 10/1988 Kouzuchi et al. .................. 357/76

OTHER PUBLICATIONS

Japanese Patent Disclosure (kokai) No. 62-216367 Sep. 22, 1987.

Primary Examiner—Rolf Hille
Assistant Examiner—S. V. Clark
Attorney, Agent, or Firm—Finnegan, Henderson, Farabow, Garrett, and Dunner

[57] ABSTRACT

A crimp-type semiconductor device having a non-alloy structure according to this invention has a silicon pellet including a plurality of cathode electrodes and a plurality of gate electrodes arranged to be alternately staggered with the cathode electrodes at the cathode side, and an anode electrode at the anode side. The cathode electrodes are crimped by a cathode electrode post via an electrode member constituted by a thin soft-metal plate and a hard metal plate. The anode electrode is crimped by an anode electrode post via an electrode member. Opposing surfaces of the electrodes, the electrode members, and the electrode posts are not bonded to but crimped in contact with each other. The electrode members are formed to cover the entire surfaces of the cathode electrode and the anode electrode, respectively, and the entire surface of the cathode electrode post and the anode electrode post, respectively. The electrode members and the electrode posts are positioned with respect to each other by positioning guides, respectively.

15 Claims, 5 Drawing Sheets

FIG. 7B  STRESS DISTRIBUTION

CRIMP-TYPE SEMICONDUCTOR DEVICE HAVING NON-ALLOY STRUCTURE

BACKGROUND OF THE INVENTION

1. Field of the Invention

The present invention relates to a power crimp-type semiconductor device and, more particularly, to a crimp-type semiconductor device having a non-alloy structure using a crimp structure in, e.g., a reverse-blocking triode thyristor (SCR), a gate turnoff (GTO) thyristor, and a transistor in which a semiconductor pellet and an electrode member are not brazed to each other.

2. Description of the Related Art

Figure 1:
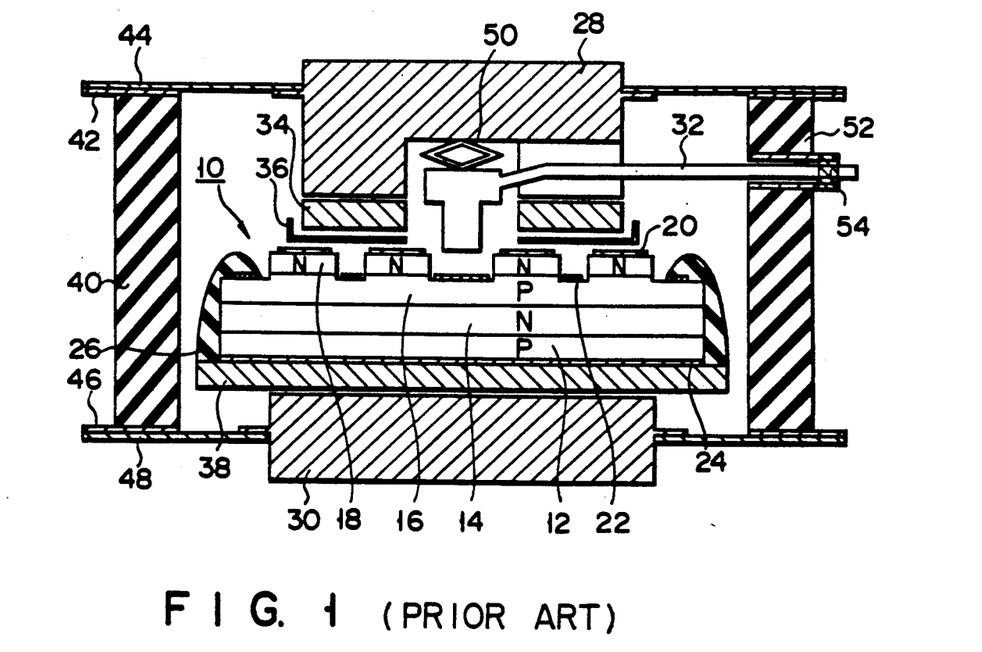
FIG. 1 is a schematic sectional view of a GTO thyristor as a prior art crimp-type semiconductor device.

In general, a structure of a power semiconductor device adopts a crimp package in order to satisfy special conditions such as heat radiation, a current capacity, blast proofing, and a diameter of a semiconductor pellet. Of these power semiconductor devices, FIG. 1 shows a prior art GTO thyristor as a crimp-type semiconductor device having a control electrode for controlling power. Note that in the accompanying drawings, members not bonded but in contact with each other are apparently separated for illustrative convenience.

FIG. 1 is a schematic sectional view of the prior art GTO thyristor. As shown in FIG. 1, a silicon semiconductor pellet 10 comprises a disk-like p-type emitter layer 12, n- and p-type base layers 14 and 16, and a plurality of n-type emitter layers 18. The n-type emitter layers 18 are a plurality of island regions formed on the p-type base layer 16, and an aluminium (Al) cathode electrode 20 is formed on each layer 18. An Al continuous gate electrode 22 is formed on a portion on the p-type base layer 16 at which no n-type emitter layer 18 is formed. An Al anode electrode 24 serving as a brazing material is formed on the lower surface of the p-type emitter layer 12. The circumferential surface of the semiconductor pellet 10 constituted by these layers is protected by an insulating silicon resin 26.

Cathode and anode electrode posts 28 and 30 each comprising copper are arranged to oppose each other at cathode and anode sides (upper and lower sides in FIG. 1), respectively, so as to sandwich the pellet 10. The cathode electrode post 28 is a partially hollow cylindrical member having a gate lead 32 (to be described later) therein. The cathode electrode post 28 crimps the cathode electrode 20 via a cathode electrode plate 34 and a thin cathode electrode plate 36 each comprising molybdenum (Mo), and the anode electrode post 30 crimps the anode electrode 22 via an anode electrode plate 38 comprising molybdenum (Mo). Note that the anode electrode 24 and the anode electrode plate 38 are brazed with each other.

A ceramic insulating cylindrical member 40 is arranged to surround the outer surface of the pellet 10. The cylindrical member 40 is silver-brazed to the cathode electrode post 28 via ring metal plates (kovar) 42 and 44 called a weld ring, and to the anode electrode post 30 via ring metal plates 46 and 48 of the same type, thereby constituting a package for air-tightly sealing its interior.

The gate lead 32 is arranged in the hollow and insertion portions of the cathode electrode post 28, the cathode electrode plate 34, and the thin cathode electrode plate 36 via an electrical insulating member (not shown). One end of the lead 32 is crimped to the gate electrode 22 by a gate crimp spring 50 via the electrical insulating member (not shown). The other end of the lead 32 is guided outside through a metal sleeve 52 brazed on the circumferential surface of the cylindrical member 40, and is sealed by a sealing portion 54.

When a forward voltage is applied on the GTO thyristor having the above arrangement to flow a gate trigger current through the gate electrode, the GTO thyristor is turned on. That is, a load current (ON current) is flowed from the anode electrode post 30 to the cathode electrode post 28 via the semiconductor pellet 10.

While a normal thyristor is turned off by flowing a main current in the opposite direction from a commutation circuit, the GTO thyristor is turned off by flowing a gate current in the opposite direction. For this reason, the n-type emitter layer of the GTO thyristor is divided into small islands so as to be easily turned off, and the gate electrode is formed to surround each island emitter layer.

A thermal expansion coefficient of the silicon pellet 10 largely differs from that of the electrode posts 28 and 30. Therefore, in order to protect the pellet 10 against a thermal stress, an electrode comprising tungsten (W) or Mo is formed between the pellet 10 and the posts 28 and 30. In particular, such an electrode plate having a proper thickness is brazed to the silicon pellet at the anode side.

In the silicon pellet backed with the electrode plate having high stiffness, almost no damage such as a crack is produced by a thermal stress of the electrode post and the like at the cathode side. In addition, even if the positions or sizes of the upper and lower electrodes differ, no large difference is produced in its characteristics.

The silicon pellet (to be referred to as a "silicon pellet having an alloy structure" hereinafter) brazed to an electrode plate consisting of W or Mo has the following problems.

(i) Although W or Mo having a thermal expansion coefficient close to that of silicon (Si) is used for an electrode plate, an influence caused by a difference between the thermal expansion coefficients cannot be completely eliminated, thereby producing warping in the pellet of an alloy structure. Therefore, since a crimp pressure becomes nonuniform, reliability is not improved.

(ii) Since a W or Mo plate is heavy, the pellet having an alloy structure is inconvenient to be carried in the manufacture. For example, it is difficult to manufacture the pellet having an alloy structure by using the same manufacturing line as a pellet process of an IC or the like.

(iii) Al as a brazing material and Si form an alloy which is bonded to a brazed portion between an electrode plate and a silicon pellet. In this case, a eutectic alloy of Al and Si is sometimes produced and partially projects in an Si substrate, thereby degrading a withstand voltage or characteristics of an element.

(iv) Since an Al projection or a thick brazing layer (>20 μm) is formed at the brazed portion, a shallow diffusion layer cannot be formed on a pellet at a brazing side (anode side).

In order to solve the above problems, a device having a structure (to be referred to as a "silicon pellet having a non-alloy structure" hereinafter) in which an anode electrode of a silicon pellet and an electrode plate are not brazed with each other has been proposed.

Since, however, a single silicon pellet not brazed to an electrode plate is brittle, the silicon pellet may crack due to a difference in thermal expansion coefficient between the silicon pellet and the electrode plate when it is crimped or vibrated or subjected to a temperature cycle test or a thermal fatigue test.

Figure 2:
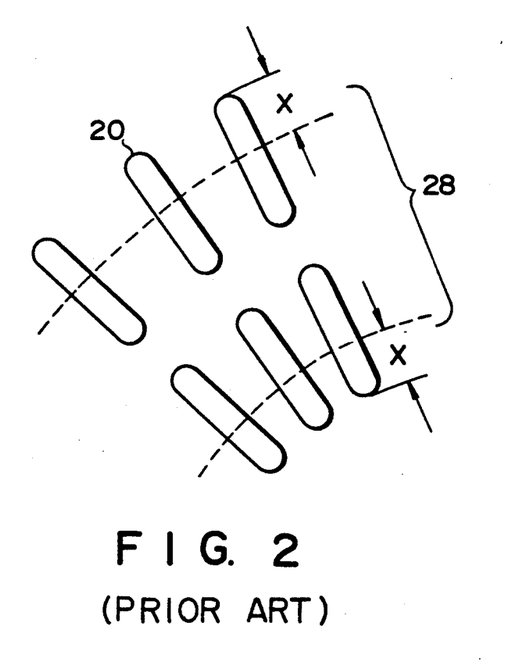
FIG. 2 is a partial plan view schematically showing a positional relationship between cathode electrode patterns and a cathode electrode post of the prior art GTO thyristor shown in FIG. 1, in which the cathode electrodes are radially arranged.
Figure 3:
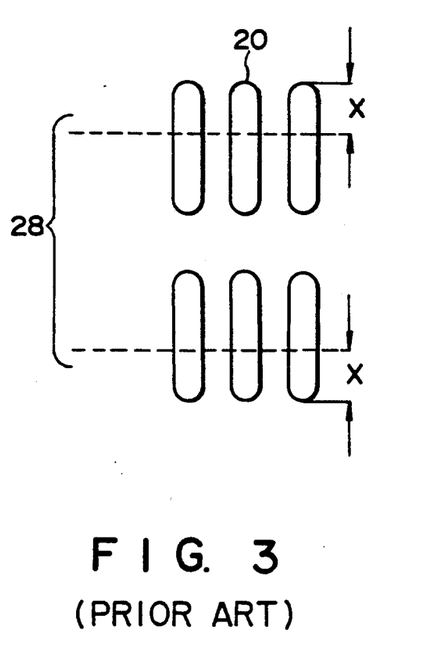
FIG. 3 is a partial plan view schematically showing the positional relationship between the cathode electrode patterns and the cathode electrode post of the prior art GTO thyristor, in which the island cathode electrodes are arranged parallel to each other.

FIG. 2 is a partial plan view schematically showing a positional relationship between patterns (indicated by solid lines) of the cathode electrodes 20 and the cathode electrode post 28 (indicated by broken lines) on the major surface of the silicon pellet of the prior art GTO shown in FIG. 1. As shown in FIG. 2, the cathode electrodes 20 are formed on the n-type emitter layers 18 radially arranged on the p-type base layer 16. FIG. 3 shows a prior art in which island-like patterns of the cathode electrodes 20 are arranged parallel to each other. That is, FIG. 3 is a partial plan view schematically showing a positional relationship between the patterns (solid lines) of the cathode electrodes 20 and the cathode electrode post 28 (broken lines). Note that referring to FIGS. 2 and 3, reference symbol x denotes a region against which the cathode electrode post 28 does not abut.

A crimp stress acting on the cathode electrode of the silicon pellet largely changes near boundary portions of the electrode post 28 indicated by the broken lines in FIGS. 2 and 3. Therefore, if a heat cycle is repeated while such a nonuniform crimp stress is applied, a thermal stress caused by a thermal expansion difference is further applied. Therefore, the silicon pellet having a non-alloy structure may crack within a short time period.

Figures 4A, 4B:
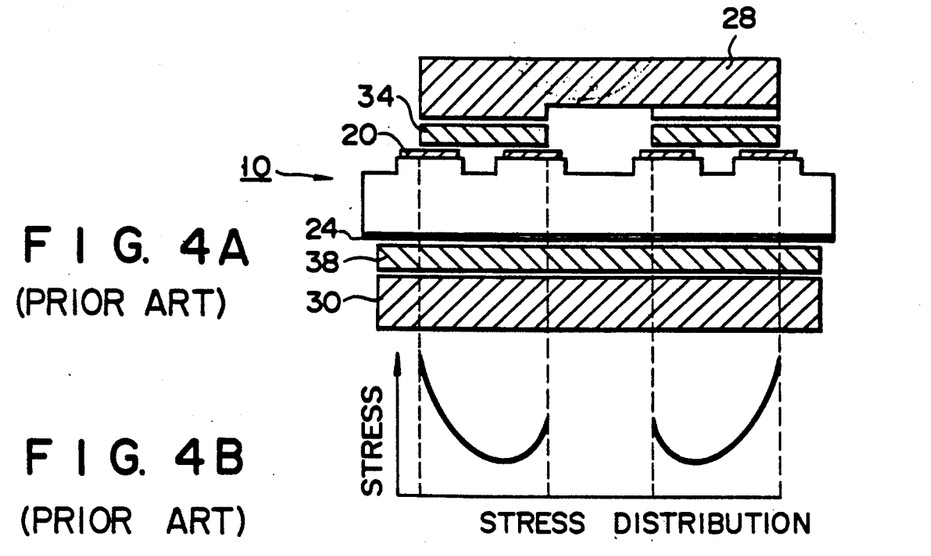
FIGS. 4A and 4B are a schematic partial sectional view of a partially-omitted prior art GTO thyristor having a non-alloy structure and a graph showing its stress distribution, respectively.

For example, with reference to a schematic partial sectional view of a partially-omitted GTO thyristor having a non-alloy structure and its stress distribution view shown in FIGS. 4A and 4B, respectively, a stress distribution on a cathode electrode surface is as follows. That is, referring to FIG. 4A, an outer diameter of the cathode electrode plate 34 at the cathode electrode side is smaller than that of the cathode electrode pattern 20. In addition, a diameter of a hollow portion in the plate 34 is larger than that of a hollow portion of the pattern 20. That is, although the plate 34 covers the pattern 20, it does not cover the entire surface of the pattern 20. In such a GTO thyristor, stress maximum values are present at the inner and outer boundary ends at which the plate 34 crimps the cathode electrode. Therefore, a major current density at these ends becomes very large.

When heat radiation characteristics of the prior art GTO thyristor shown in FIG. 1 and a GTO thyristor having a non-alloy structure which has the same shape and size as those of the prior art GTO thyristor shown in FIG. 1 and in which an anode electrode plate is not alloy-brazed to a silicon pellet were measured, head radiation characteristics at portions not crimped (regions indicated by reference symbol x in FIGS. 2 and 3) were poor.

When the positional relationship between the cathode electrode and the electrode post is as shown in FIG. 2, currents are significantly concentrated at the crimped end portions in the non-alloy structure. As a result, a withstand voltage with respect to a surge current, a turnoff overcurrent, or the like is reduced.

Figure 5:
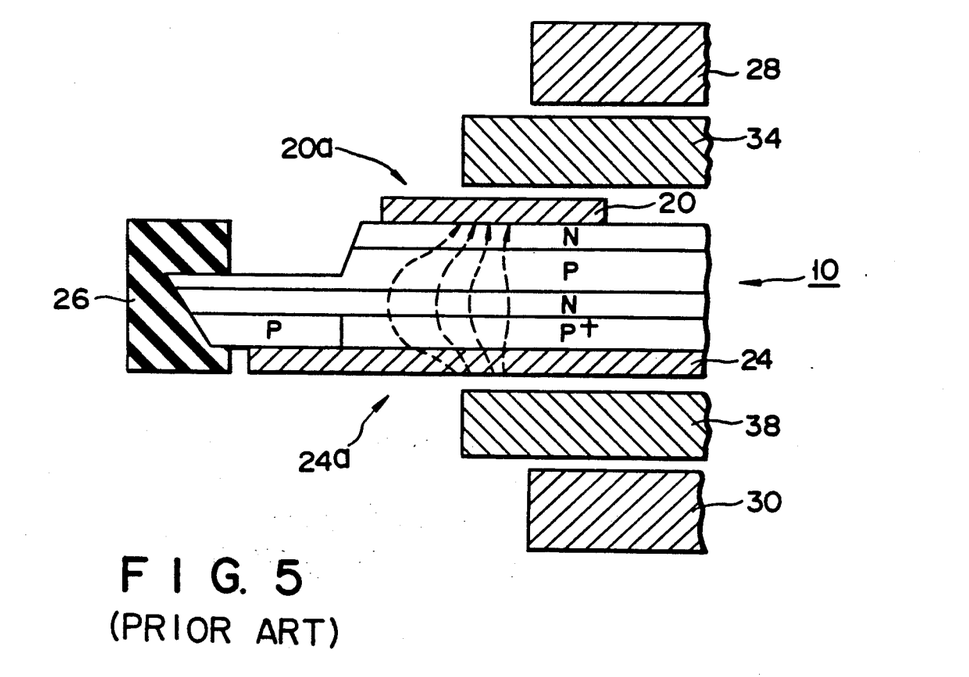
FIG. 5 is a schematic partial sectional view of a prior art thyristor having a non-alloy structure.

FIG. 5 is a schematic partial sectional view of a thyristor having a general non-alloy structure. Referring to FIG. 5, a cathode electrode pattern 20 and an anode electrode 24 are partially crimped by cathode and anode electrode plates 34 and 38, respectively. In portions 20a and 24a not crimped by the electrode plates 34 and 38, respectively, currents (indicated by broken arrows in FIG. 5) flowing in a pellet 10 flow through the partial contact portions of the electrode plates 34 and 38, respectively. Therefore, an electric resistance is increased, and a generated heat amount is conducted toward the partial contact portions. Therefore, a thermal resistance in this region is increased to cause insufficient heat radiation.

As described above, a semiconductor device using the silicon pellet having an alloy structure has the above various problems caused by alloy brazing, e.g., a problem in which no uniform crimp pressure can be obtained due to warping of the pellet. In a device using the silicon pellet having a non-alloy structure in which an electrode plate is not brazed in order to solve the above problems, a single silicon pellet is brittle. Therefore, if the silicon pellet is formed into a non-alloy structure by a crimp pressure more uniform than in the alloy structure device, a thermal resistance changes. Therefore, if the shape and size are kept unchanged, no uniform heat radiating effect can be obtained.

SUMMARY OF THE INVENTION

It is, therefore, an object of the present invention to provide, in a crimp-type semiconductor device having a control electrode, a crimp-type semiconductor device having a non-alloy structure in which compression bonding can be uniformly performed without applying a local excessive crimp pressure or stress on a semiconductor pellet, a satisfactory heat radiating effect can be obtained, current concentration at crimped end portions can be relaxed, and a high overcurrent withstand voltage can be obtained.

According to an aspect of the present invention, there is provided a crimp-type semiconductor device comprising: a semiconductor pellet having first and second major surfaces and having main electrodes formed on the first and second major surfaces, and a control electrode formed on at least one of the first and second major surfaces, the main electrode and the control electrode being formed on one of the major surfaces so as to be alternately staggered with each other; first and second electrode members, each having first and second opposing surfaces, arranged such that the first opposing surfaces are not bonded to but crimped in contact with the first and second major surfaces, respectively, each of the first opposing surfaces being formed to cover the entire surface of the main electrode; first and second electrode post means, formed to be not bonded to but crimped in contact with the second opposing surfaces of the first and second electrode members, respectively, for crimping the main electrodes formed on the first and second major surfaces via the first and second electrode members, respectively, the entire surfaces of the first and second electrode post means being covered with the second opposing surfaces of the first and second electrode members, respectively; and positioning guide means, formed close to at least one of the first and second electrode members and at least one of the first and second electrode posts, for positioning at least one of the first and second electrode members with respect to at least one of the first and second electrode post means to be crimped against the electrode member.

BRIEF DESCRIPTION OF THE DRAWINGS

These and other features and advantages of the present invention will become more apparent from the following detailed description of exemplary embodiments as illustrated in the accompanying drawings in which.

DETAILED DESCRIPTION OF THE PREFERRED EMBODIMENTS

Embodiments of the present invention will be described below with reference to the accompanying drawings. Note that in the accompanying drawings, the same reference numerals as in the prior art described above denote the same elements and a detailed description thereof will be omitted, and members not bonded but in contact with each other are apparently separated for illustrative convenience.

Figure 6:
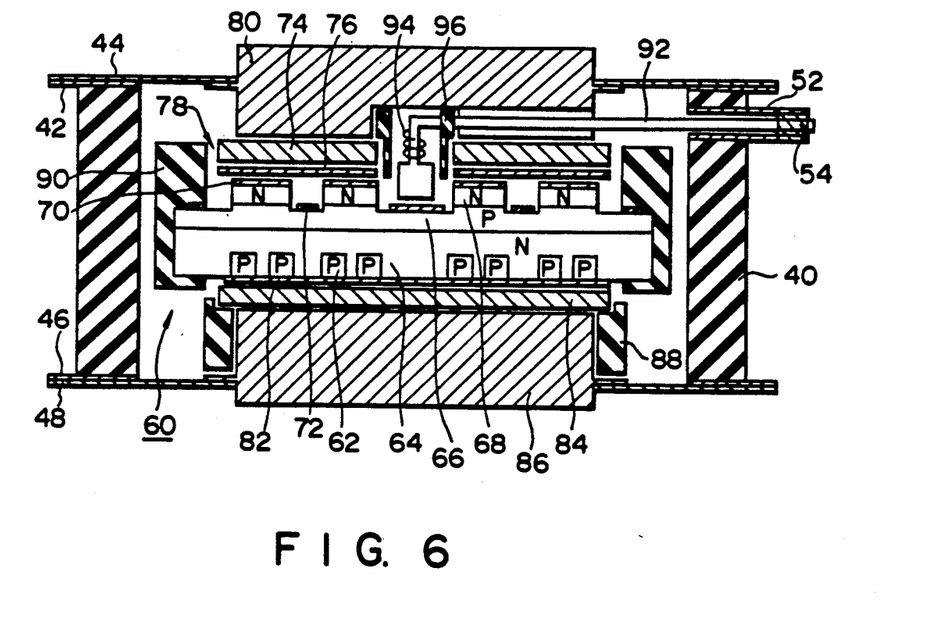
FIG. 6 is a schematic sectional view of an anode short-circuiting GTO thyristor showing the first embodiment of a crimp-type semiconductor device according to the present invention.

FIG. 6 is a sectional view schematically showing an anode short-circuiting GTO thyristor as a crimp-type semiconductor device according to the first embodiment of the present invention. Referring to FIG. 6, a semiconductor pellet 60 has a four-layered structure in which a p-type emitter layer 62, an n-type base layer 64, a p-type base layer 66, and an n-type emitter layer 68 are arranged from an anode side (lower side in FIG. 6) serving as a second major surface to a cathode side (lower side in FIG. 6) serving as a first major surface. The p-type emitter layer 62 is not formed on the entire lower surface of the n-type base layer 64 but partially formed in a plurality of regions in a lower portion of the layer 64. The layers 64 and 66 form a disk-like shape. In addition, the n-type emitter layer 68 is not uniformly formed on the upper surface of the p-type base layer 64 but partially formed in, e.g., a plurality of radially divided regions.

A cathode electrode 70 serving as a main electrode is formed on the n-type emitter layer 68 of the pellet 60. A gate electrode 72 as a control electrode is formed on a portion on the p-type base layer 66 at which no n-type emitter layer 68 is formed. That is, the cathode electrode 70 is formed to be surrounded by the gate electrode 72. Therefore, the cathode and gate electrodes 70 and 72 located at different levels not on the same plane are formed on the first major surface so as to be alternately staggered with each other. The cathode electrode 70 on the first major surface of the pellet 60 is crimped by a cylindrical cathode electrode post 80 having a hollow central portion via a cathode-side electrode member 78 constituted by a disk-like electrode plate 74 having an opening formed at its central portion to receive a gate lead 88 described later) and by a thin soft-metal plate 76.

In order to receive a stress applied on the cathode electrode 70, the cathode-side electrode member 78 is constituted by a metal plate obtained by overlapping the electrode plate 74 (called a thermal buffer plate or a temperature compensating plate) comprising Mo or W which is hard and has a thermal expansion coefficient close to a silicon pellet and the thin soft-metal plate 76 comprising, e.g., aluminum (Al), silver (Ag), or copper (Cu). In this case, the cathode-side electrode member is not limited to that in this embodiment. For example, a plate constituted by both hard- and soft-metal plates disclosed in Japanese Patent Application No. 62-78653 can be used as the cathode-side electrode plate.

An anode electrode 82 serving as a main electrode is formed at an anode side of the pellet 60, thereby constituting a so-called anode short-circuiting structure for short-circuiting the p-type emitter layer 62 and the partially exposed n-type base layer 64. The anode electrode 82 on the second major surface of the pellet 60 is crimped by an anode electrode post 86 via an anode-side electrode member 84. Each of the electrode 82, the electrode member 84, and the electrode post 86 is formed into a disk-like or cylindrical member. Note that reference numeral 88 denotes a positioning guide for positioning the electrode member 84 and the electrode post 86.

The electrode members at the cathode and anode sides are formed to cover the entire surfaces of the opposing main electrodes (cathode and anode electrodes 70 and 82), respectively. Therefore, an outer diameter of the electrode member 78 including the hard electrode plate 74 and the thin soft-metal plate 76 is formed to be larger than that of the cathode electrode pattern 70. In addition, an inner diameter of the electrode member 78 is formed to be smaller than that of the electrode pattern 70. An outer diameter of the anode-side electrode member 84 is formed to be larger than that of the anode electrode 82. These are described in, e.g., Japanese Patent Application No. 63-86607. As a result, uniformity of a crimp pressure between the cathode electrode and the cathode-side electrode member, and between the anode electrode and the anode-side electrode member can be largely improved.

In order to maintain an anode-to-cathode withstand voltage, the circumferential surface of the pellet 60 is bevel-etched. Thereafter, a silicone resin 90 for passivation (insulation protection) is coated on the surface.

A ceramic insulating cylindrical member 40 is arranged to surround the outer surface of the pellet 60. The cylindrical member 40 is silver-brazed to the cathode electrode post 80 via ring metal plates (kovar) 42 and 44 called a weld ring, and to the anode electrode post 86 via ring metal plates 46 and 48 of the same type, thereby constituting a package for air-tightly sealing its interior.

As shown in FIG. 6, a substantially L-shaped gate lead 92 is arranged in the hollow portions of the cathode electrode post 80 and the cathode-side electrode member 78. One end of the lead 92 is crimped against the gate electrode 72 by a gate crimp spring 94 via an electrical insulating member (not shown). In the hollow portions of the post 80 and the electrode member 78, a positioning guide 96 constituted by an insulating material is arranged around the end of the gate lead 92.

The guide 96 is formed as positioning means for positioning the main electrodes, the electrode members, and the electrode posts. That is, as described in U.S. Pat. No. 4,587,550, the semiconductor pellet 60 is positioned with respect to the electrode members 78 and 84 via the insulation protecting silicone resin 90 on the circumferential surface. The cathode-side electrode member 78 and the cathode electrode post 80 are positioned by the positioning guide 96. The guide 96 also positions the gate lead 92 and comprises an insulating material such as a fluoroplastic (e.g., Teflon (tradename): available from Du Pont de Nemours, E. I., Co.) or an epoxy resin. The guide 96 is an annular cylindrical member having a step on its outer circumferential surface. An outer diameter of an upper portion of the outer circumferential surface is the same as a diameter of the hollow portion of the electrode post 80, and an outer diameter of its lower portion is the same as a diameter of the hollow portion of the electrode member 78. The anode-side electrode member 84 and the anode electrode post 86 are positioned by the positioning guide 88. The guide 88 is an annular cylindrical member (illustrated as an insulating material in FIG. 6) comprising an insulating material, e.g., a metal such as Al, a fluoroplastic, or an epoxy resin and having a step on its inner circumferential surface. An inner diameter of an upper portion of the inner circumferential surface is the same as an outer diameter of the electrode member 78, and an inner diameter of its lower portion is the same as an outer diameter of the electrode post 80.

The other end of the gate lead 92 is guided outside through an insertion portion formed in the guide 96 and the post 80 and through a metal sleeve 52 brazed to the circumferential surface of the insulating cylindrical member 40, and is sealed at a sealing portion 54.

In the crimp-type semiconductor device having the above arrangement, opposing surfaces of the main electrodes, the electrode members, and the electrode posts at both the cathode and anode sides are not brazed by an alloy or the like but brought into contact and crimped, thereby forming a non-alloy structure.

Figures 7A, 7B:
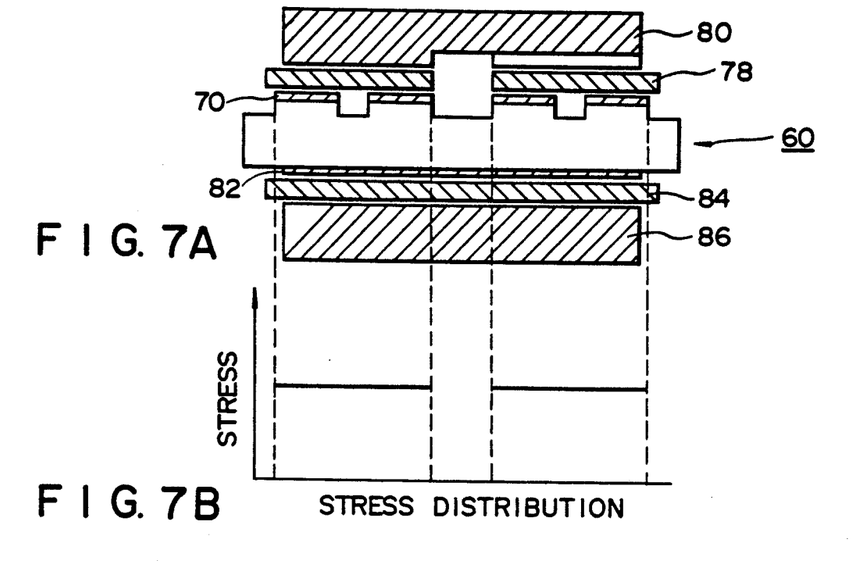
FIGS. 7A and 7B are schematic partial sectional view of a partially-omitted GTO thyristor having the non-alloy structure shown in FIG. 6 and a graph showing its stress distribution, respectively.

FIG. 7A is a schematic partial sectional view of a partially-omitted GTO thyristor having the non-alloy structure shown in FIG. 6, and FIG. 7B is a graph showing its stress distribution. Referring to FIGS. 7A and 7B, an outer diameter of the cathode electrode plate 78 at the cathode electrode side is larger than or the same as an outer diameter of the cathode electrode pattern 70. The outer diameter of the pattern 70 is formed to be larger than an outer diameter of the cathode electrode post 80. The hollow portions of the electrode plate 78, the electrode post 80, and the electrode pattern 20 have the same diameter. That is, the cathode electrode plate 78 covers the entire surface of the cathode electrode pattern 70. With this structure, a uniform stress acts on the cathode electrode 70 as shown in FIG. 7B so that the electrode 70 is uniformly crimped. Therefore, since heat radiation becomes uniform to improve electrical characteristics, the silicon pellet 60 does not crack to improve is reliability.

When the electrode member 78 is constituted by only the hard electrode plate 74 and its repeatedly subjected to a heat cycle, it causes thermal fatigue. As a result, the cathode electrode 70 expands in the lateral direction in FIG. 6 and is brought into contact with the gate electrode. When thermal fatigue further progresses, the electrode plate 74 and the pellet 60 are crimped via the cathode electrode 70, and the pellet 60 is sometimes pulled to crack by thermal expansion of the electrode plate 74. As described in, e.g., Japanese Patent Application No. 62-78653, however, by arranging the thin soft-metal plate 76 between the hard electrode plate 74 and the cathode electrode 70, the crack can be prevented.

The cathode-side electrode member 78 covers the entire surface of the n-type emitter layer 68, and the anode-side electrode member 84 covers the entire surface of the p-type emitter layer 62. Therefore, the cathode electrode 70 is formed throughout the entire surface of the n-type emitter layer 68. In addition, the n- and p-type emitter layers 68 and 62 form a flow path for the main current, and the main electrode is formed throughout the entire sectional area of the flow path. Therefore, uniformity of a contact electrical resistance and a thermal resistance on a crimp surface is improved to improve the heat radiating effect, thereby relaxing local current concentration in the pellet 60.

Figure 8:
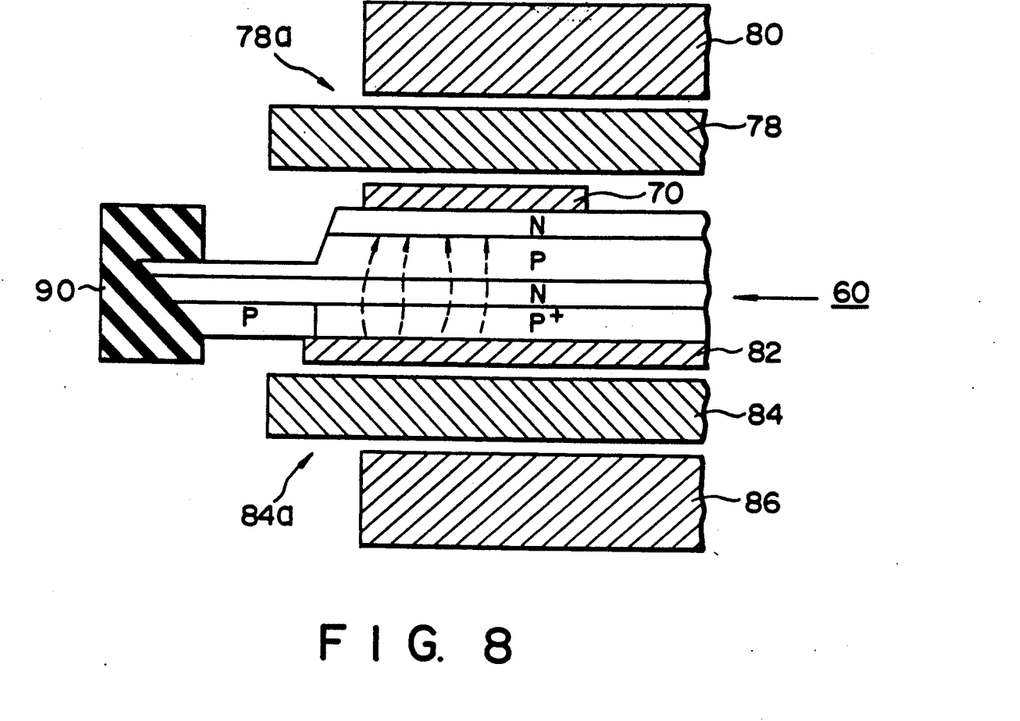
FIG. 8 is a schematic partial sectional view of a thyristor having the non-alloy structure shown in FIG. 6.

FIG. 8 is a schematic partial sectional view of a thyristor having the non-alloy structure shown in FIG. 6, in which the entire surfaces of the cathode electrode pattern 70 and the anode electrode 82 are covered with and crimped by the cathode-side electrode member 78 and the anode-side electrode member 84, respectively. In this manner, currents (indicated by broken arrows in FIG. 8) and heat flows flowing through the pellet 60 are uniformed, and a heat radiating effect at portions 78a and 84a not crimped by the electrode posts 80 and 86 is improved. As shown in FIG. 8, since current concentration at the non-crimped regions is prevented, an overcurrent withstand voltage with respect to, e.g., a surge current or a turnoff overcurrent is increased.

In general, in a flat-package-type crimp-type semiconductor device, a flow path of a main current flowing through the device and a heat conducting path for radiating heat generated in a pellet are assumed to be approximately, substantially equal to each other. Therefore, it is preferred to arrange a profile of PNPN layers of the pellet such that a region through which a main current substantially flows in the semiconductor pellet is covered with electrode members. With this arrangement, no big difference is produced in a density of the main current flowing through the pellet and a main electrode.

In addition, the electrode members at both the cathode and anode sides cover the entire surfaces of the corresponding electrode posts (Cu), respectively.

Therefore, as compared with a device in which one electrode member covers the entire surfaces of electrode posts as disclosed in Published Unexamined Japanese Patent Application No. 53-95584, the uniformity of a crimp pressure is further improved by a synergistic effect of the two electrode members. For example, as described in Published Examined Japanese Utility Model Application No. 54-41657, an outer diameter of the cathode electrode post 80 is formed to be smaller than that of the opposing cathode-side electrode member 78, and an outer diameter of the anode electrode post 86 is formed to be smaller than that of the opposing anode-side electrode member 84. Therefore, the copper electrode post does not deform when the device is used in a crimped state.

In the arrangement having the above shape/size relationship between the cathode-side electrode member 78, the cathode electrode 70, the cathode electrode post 80, and the n-type emitter layer 68, and the above shape/size relationship between the anode-side electrode member 84, the anode electrode 82, the anode-side electrode post 86, and the p-type emitter layer 62, the outer diameters of a pair of electrodes 70 and 82, a pair of electrode members 78 and 84, and a pair of electrode posts 80 and 86, each pair opposing at both the sides of the pellet 60, are formed equal to each other, respectively. In this manner, good uniformity with a high crimp pressure can be obtained.

In addition, by forming a step on the positioning guide 88 which is an annular cylindrical member, a vertical vibration and the like of the guide 88 can be prevented. Note that the shapes of the positioning guides 88 and 96 are not limited to the structures described above. For example, means disclosed in Published Unexamined Japanese Patent Application No. 62-176137 can be used.

Furthermore, the positioning guide 88 preferably has a structure in which a slit is formed along its thickness (widthwise) direction to absorb a size difference produced due to a difference in thermal expansion coefficient between the electrode member 78 (Mo) and the electrode post 80 (Cu).

Figure 9:
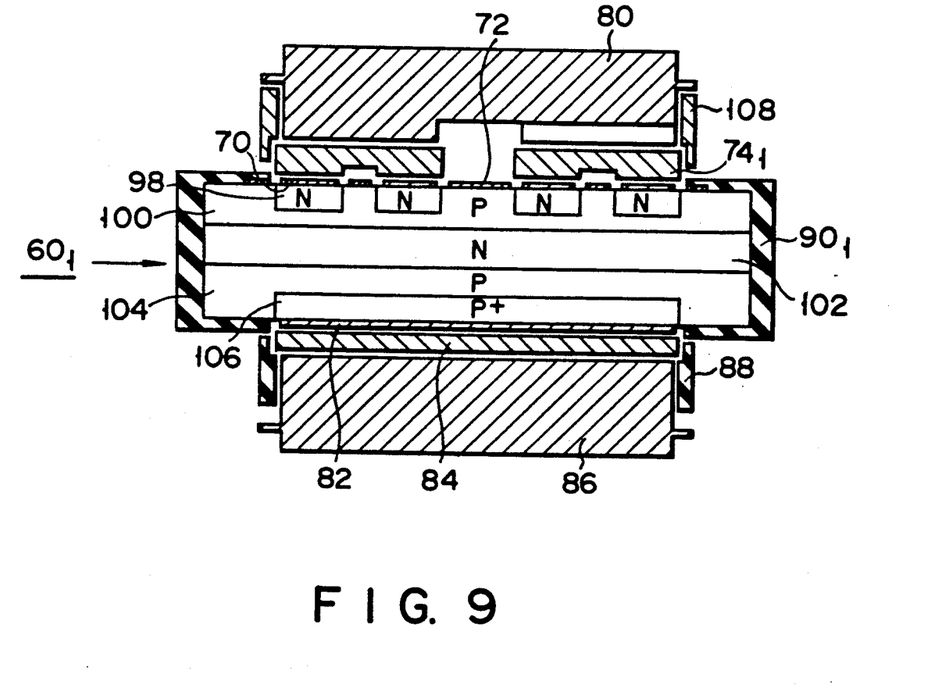
FIG. 9 is a schematic sectional view of a reverse blocking planar GTO thyristor showing the second embodiment of a crimp-type semiconductor device according to the present invention.

FIG. 9 is a schematic sectional view of a crimp-type semiconductor device according to the second embodiment of the present invention. Note that in the following embodiments, some members such as an insulating cylindrical member constituting a package will be omitted, and the same reference numerals as in FIG. 6 denote the same parts and a detailed description thereof will be omitted.

FIG. 9 shows a reverse-blocking planar GTO thyristor in which an n-type emitter layer 98 and a p-type base layer 100 are formed in a planar manner and a cathode electrode 70 and a gate electrode 72 are formed to be alternately staggered with each other on the same plane at a cathode side serving as a first major surface of a semiconductor pellet $60_1$. As shown in FIG. 9, a p-type emitter layer 104 is formed on the lower surface of an n-type base layer 102 formed below the p-type base layer 100 so as to cover the entire region serving as a second major surface of the pellet $60_1$. A high-concentration $p^+$-type emitter layer 106 is selectively formed in the p-type emitter layer 104. In this case, the layer 106 is preferably formed in a region in which a main current substantially flows, i.e., a region located inside an outer diameter of an anode-side electrode member 84. An insulation protecting silicone resin $90_1$ is coated on the circumferential surface of the pellet $60_1$. As the cathode-side electrode member, an electrode plate $74_1$ not including a thin soft-metal plate and having recesses on its crimp surface as shown in FIG. 9 so as not to be brought into contact with the gate electrode 72 is used.

A positioning guide 108 is in contact with the circumferential surfaces of the electrode plate $74_1$ and an electrode post 80 and comprises a metal or an insulating material (in FIG. 9, a metal). The guide 108 has the same object and effect as a positioning guide 88 formed at the anode side.

Figure 10:
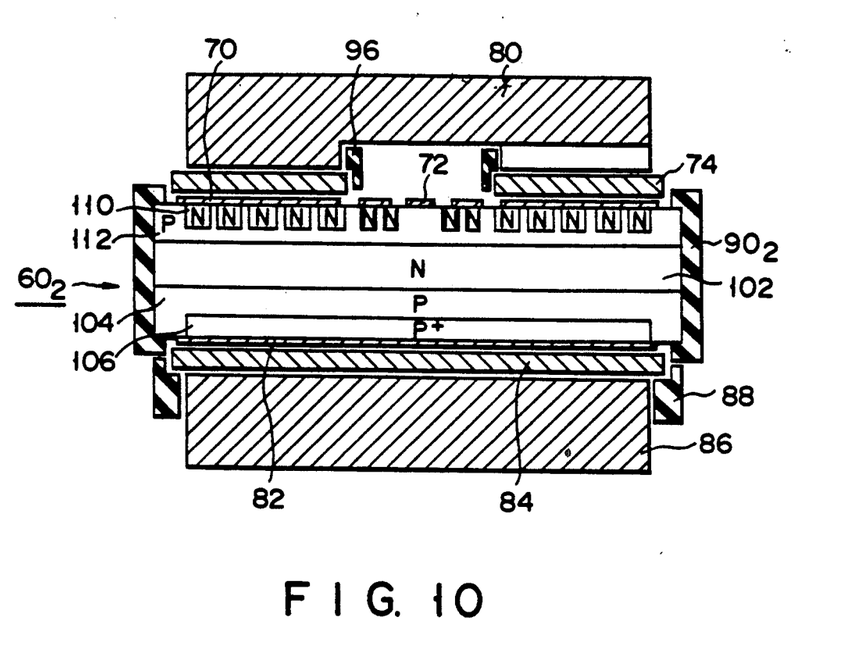
FIG. 10 is a schematic sectional view of an emitter short-circuiting thyristor showing the third embodiment of a crimp-type semiconductor device according to the present invention.

FIG. 10 is a schematic sectional view of a general emitter short-circuiting thyristor according to the third embodiment of the present invention.

Referring to FIG. 10, a plurality of n-type emitter layers 110 and a p-type base layer 112 are formed in a planar manner at a cathode side serving as a first major surface of a semiconductor pellet $60_2$. The layer 112 is partially exposed on the substrate surface. A cathode electrode 70 is formed flat so that the plurality of emitter layers 110 and the base layer 112 are short-circuited. A gate electrode 72 is formed between the emitter layers 110 and at the center of the base layer 112.

An n-type base layer 102 and a p-type emitter layer 104 are formed on the lower surface of the base layer 112. A high-concentration $p^+$-type emitter layer 106 is selectively formed in the emitter layer 104. In this case, the emitter layer 106 is formed to be covered with an anode-side electrode member 84. An insulation protecting silicone resin $90_2$ is coated on the circumferential surface of the pellet $60_2$. As a cathode-side electrode member, an electrode plate 74 not including a thin soft-metal plate is used to directly crimp the cathode electrode 70.

Figure 11:
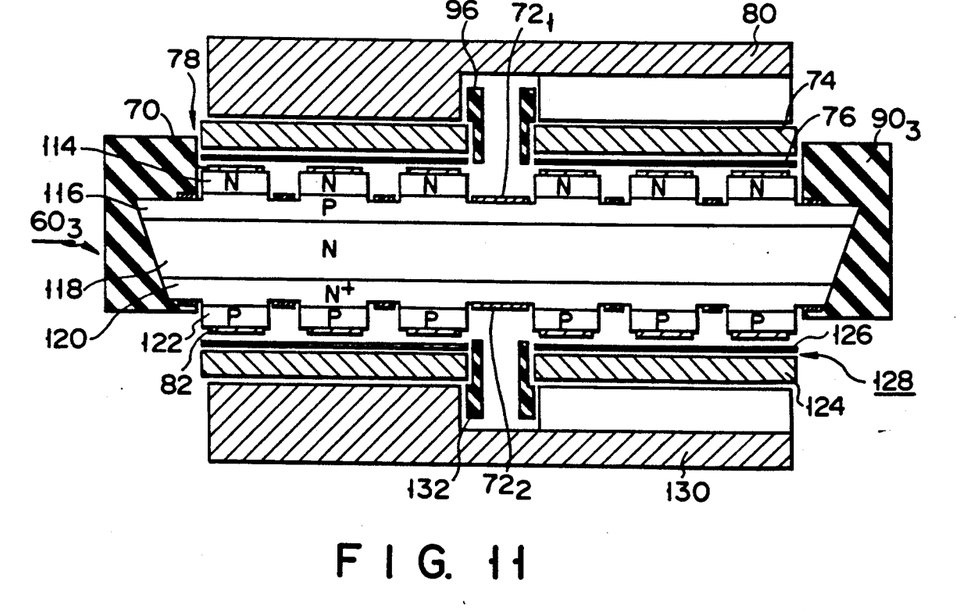
FIG. 11 is a schematic sectional view of a double gate GTO thyristor showing the fourth embodiment of crimp-type semiconductor device according to the present invention.

FIG. 11 is a schematic sectional view of a double gate GTO thyristor according to the fourth embodiment of the present invention.

Referring to FIG. 11, a semiconductor pellet $60_3$ has a multilayered structure constituted by a plurality of n-type emitter layers 114, a p-type base layer 116, an n-type base layer 118, an $n^+$-type buffer layer 120, and a plurality of p-type emitter layers 122. A cathode electrode 70 is formed on the lower surface of each of the emitter layers 114, and a plurality of first gate electrodes $72_1$ are formed on the base layer 116. An anode electrode 82 is formed on each of the p-type emitter layers, and a plurality of second gate electrodes $72_2$ are formed on the lower surface of the buffer layer 120. In this case, on either of the major surfaces at the cathode and anode sides of the pellet $60_3$, the main electrode (the cathode electrode 70 or the anode electrode 82) and the control electrode (the first or second gate electrode $72_1$ or $72_2$) are formed to be alternately staggered with each other.

The anode electrode 82 and an anode-side electrode member 128 constituted by a hard electrode plate 124 and a thin soft-metal plate 126, an anode electrode post 130, and a positioning guide 132 at the anode side serving as the second major surface correspond to and have the same arrangement as the cathode electrode 70, a cathode-side electrode member 78 constituted by a hard electrode plate 74 and a thin soft-metal plate 76, a cathode electrode post 80, and a positioning guide 96 at the cathode side of the first or fourth embodiment.

The present invention is no limited to the above embodiments but can be applied to, e.g., a reverse conducting thyristor, a triac, and a transistor.

What is claimed is:

1. A crimp-type semiconductor device comprising:

a semiconductor pellet having first and second major surfaces and having main electrodes formed on said first and second major surfaces, and a control electrode formed on at least one of said first and second major surfaces, said main electrodes and said control electrode being arranged on one of said major surfaces so as to alternately staggered with each other;

first and second electrode members, each having first and second opposing surfaces, arranged such that said first opposing surfaces are not bonded to but crimped in contact with said first and second major surfaces, respectively, each of said first opposing surfaces being formed to cover the entire surface of said main electrode;

first and second electrode post means, arranged to be not bonded to but crimped in contact with said second opposing surfaces of said first and second electrode members, respectively, for crimping said main electrodes formed on said first and second major surfaces via said first and second electrode members, respectively, the entire surfaces of said first and second electrode post means being covered with said second opposing surfaces of said first and second electrode members, respectively; and positioning guide means, arranged close to at least one of an inner periphery and an outer periphery of at least one of said first and second electrode members with respect to at least one of said first and second electrode post means crimped against said electrode member.

2. A device according to claim 1, wherein said first and second opposing surfaces of each of said first and second electrode members have the same size.

3. A device according to claim 1, wherein at least one of said first and second electrode members is constituted by a first metal member opposing one of said first and second major surfaces, and a second metal member opposing one of said first and second electrode post means.

4. A device according to claim 3, wherein said first metal member is constituted by a soft metal member, and said second metal member is constituted by a hard metal member.

5. A device according to claim 1, wherein said first and second electrode members are constituted by hard metal members.

6. A device according to claim 1, wherein outer diameters of said main electrodes formed on said first major surface of said semiconductor pellet and said main electrodes formed on said second major surface thereof, outer diameters of said first opposing surface of said first electrode member and said first opposing surface of said second electrode member, and outer diameters of said first electrode post means and said second electrode post means are equal to each other, respectively.

7. A device according to claim 1, wherein said positioning means have first proximity portions located close to at least one of said first and second electrode members and second proximity portions located close to at least one of said first and second electrode post means, said first and second proximity portions having different diameters to form a step therebetween.

8. A device according to claim 1, wherein said positioning means comprise a metal.

9. A device according to claim 1, wherein said positioning means comprise an insulating material.

10. A device according to claim 1, wherein said positioning means are located close to outer circumferential surfaces of at least one of said first and second electrode members and a corresponding one of said first and second electrode post means.

11. A device according to claim 1, wherein said positioning means are located close to inner circumferential surfaces of at least one of said first and second electrode members and a corresponding one of said first and second electrode post means.

12. A device according to claim 1, wherein said positioning means are located close to inner circumferential surfaces of said first electrode member and said first electrode post means, and close to outer circumferential surfaces of said second electrode member and said second electrode post means, respectively.

13. A device according to claim 1, wherein said positioning means are located close to outer circumferential surfaces of said first electrode member and said first electrode post means, and close to inner circumferential surfaces of said second electrode member and said second electrode post means, respectively.

14. A device according to claim 1, wherein said semiconductor pellet has said main electrodes and said control electrode, formed on at least one of said first and second major surfaces on different planes.

15. A device according to claim 1, wherein said semiconductor pellet has said main electrodes and said control electrode, formed on at least one of said first and second major surfaces on the same plane.

* * * * *

UNITED STATES PATENT AND TRADEMARK OFFICE
CERTIFICATE OF CORRECTION

PATENT NO. : 4,996,586

DATED : February 26, 1991

INVENTOR(S) : Hideo Matsuda et al.

It is certified that error appears in the above-identified patent and that said Letters Patent is hereby corrected as shown below:

On the title page:

Abstract, line 16, change "surface" to --surfaces--.

Claim 1, column 11, line 7, after "to" insert --be--.

Signed and Sealed this

Sixth Day of April, 1993

Attest:

STEPHEN G. KUNIN

*Attesting Officer*     Acting Commissioner of Patents and Trademarks